(12) United States Patent
Cho et al.

(10) Patent No.: US 7,169,662 B2
(45) Date of Patent: *Jan. 30, 2007

(54) METHODS FOR MAKING SEMICONDUCTOR STRUCTURES HAVING HIGH-SPEED AREAS AND HIGH-DENSITY AREAS

(75) Inventors: Chih-Chen Cho, Boise, ID (US); Zhongze Wang, Boise, ID (US)

(73) Assignee: Micron Technology, inc., Boise, OH (US)

( * ) Notice: Subject to any disclaimer, the term of this patent is extended or adjusted under 35 U.S.C. 154(b) by 57 days.

This patent is subject to a terminal disclaimer.

(21) Appl. No.: 10/699,256

(22) Filed: Oct. 30, 2003

(65) Prior Publication Data

US 2004/0171247 A1    Sep. 2, 2004

Related U.S. Application Data

(63) Continuation of application No. 09/945,077, filed on Aug. 30, 2001, now Pat. No. 6,730,553.

(51) Int. Cl.
*H01L 21/8238* (2006.01)

(52) U.S. Cl. .................... 438/233; 438/586; 438/587; 438/638; 438/643; 438/648; 438/649; 438/740

(58) Field of Classification Search ............... 438/210, 438/233, 238, 279, 586, 587, 638, 649, 722, 438/639, 643, 648, 740
See application file for complete search history.

(56) References Cited

U.S. PATENT DOCUMENTS

| | | | | |
|---|---|---|---|---|
| 5,843,816 | A * | 12/1998 | Liaw et al. | 438/238 |
| 5,899,742 | A | 5/1999 | Sun | 438/682 |
| 6,069,038 | A | 5/2000 | Hashimoto et al. | 438/241 |
| 6,083,828 | A | 7/2000 | Lin et al. | 438/639 |
| 6,121,129 | A * | 9/2000 | Greco et al. | 438/622 |
| 6,174,807 | B1 * | 1/2001 | Kizilyalli et al. | 438/655 |
| 6,271,087 | B1 | 8/2001 | Kinoshita et al. | 438/258 |
| 6,274,409 | B1 | 8/2001 | Choi | 438/128 |
| 6,300,178 | B1 | 10/2001 | Sunouchi | 438/199 |
| 6,451,708 | B1 * | 9/2002 | Ha | 438/738 |
| 6,730,553 | B2 * | 5/2004 | Cho et al. | 438/210 |

* cited by examiner

*Primary Examiner*—M. Wilczewski
*Assistant Examiner*—Toniae M. Thomas
(74) *Attorney, Agent, or Firm*—Dorsey & Whitney LLP

(57) ABSTRACT

Methods for making a semiconductor structure are discussed. The methods include forming openings in a high-density area and a high-speed area, and forming a metallization layer simultaneously into the high-density area and the high-speed area. The metallization layer includes a combination of substances and compounds that reduce vertical resistance, reduce horizontal resistance, and inhibit cross-diffusion.

24 Claims, 13 Drawing Sheets

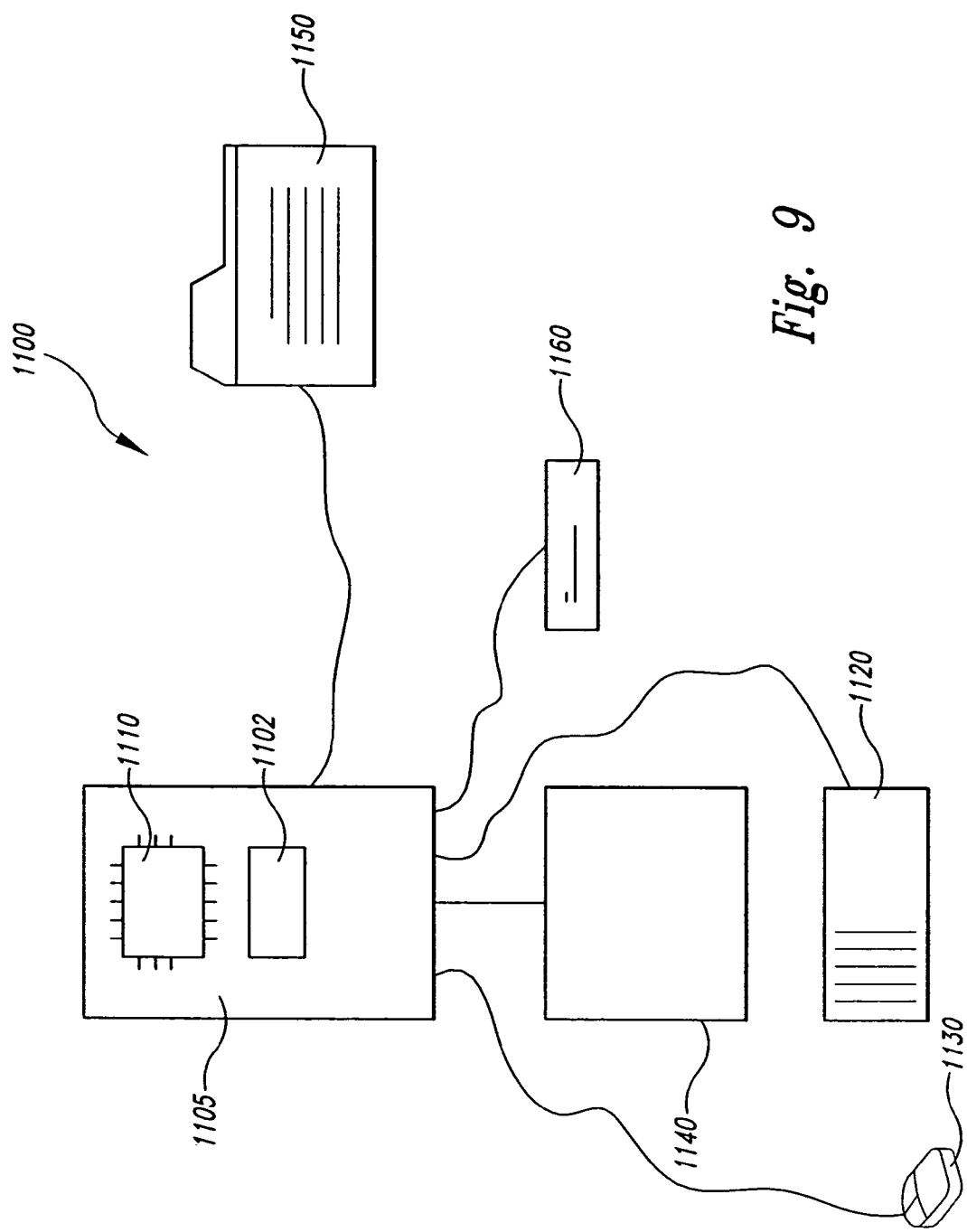

METHODS FOR MAKING SEMICONDUCTOR STRUCTURES HAVING HIGH-SPEED AREAS AND HIGH-DENSITY AREAS

CROSS-REFERENCE TO RELATED APPLICATION

This application is a continuation of U.S. patent application Ser. No. 09/945,077, filed Aug. 30, 2001, now U.S. Pat. No. 6,730,553.

TECHNICAL FIELD

This invention relates generally to semiconductor structures. More particularly, it pertains to making semiconductor devices so these devices operate at high speed while having high density.

BACKGROUND OF THE INVENTION

In the making of certain semiconductor devices, modern semiconductor processes may require a p-type semiconductor material to be adjoined to an n-type semiconductor material, but not for the purpose of forming a diode. However, a diode is naturally formed when a p-type semiconductor material is adjoined to an n-type semiconductor material. This situation allows current to undesirably flow if the diode is activated by accident in certain areas of a semiconductor structure. This current may render a semiconductor device defective. One solution to this problem is to place a conductive material on top of the n-type semiconductor material and the p-type semiconductor material as illustrated in FIGS. 1A and 1B.

FIG. 1A is a cross-sectional view taken from the front of a conventional semiconductor structure 10 and FIG. 1B is a cross-sectional plan view of the conventional semiconductor structure 10. The semiconductor structure 10 includes a gate oxide layer 8 that overlies an n-channel active area 2, a field region 18, and a p-channel active area 20. The n-channel active area 2 includes a p-type well 22 containing highly doped n-type areas 4, as shown in FIG. 1B. These highly doped areas 4 form a drain region and a source region of an n-channel transistor. The highly doped n-type areas 4 are doped with donor impurities. The p-channel active area 20 includes an n-type well 24 containing highly doped p-type areas 4, as shown in FIG. 1B. The highly doped p-type areas 4 are doped with acceptor impurities, and these highly doped p-type areas 4 form a drain region and a source region of a p-channel transistor.

The n-channel active area 2 also includes an n-type polycrystalline silicon strip 10A forming a transistor gate for the n-channel transistor, and the p-channel active area 20 includes a p-type polycrystalline silicon strip 10B forming a transistor gate for the p-channel transistor. A gate cap 12, which is formed from a nonconductive material, overlies both the n-type polycrystalline silicon strip 10A and the p-type polycrystalline silicon strip 10A. A spacer 14 surrounds a portion of the semiconductor structure 10 as shown in FIG. 1B. Both the spacer 14 and the gate cap 12 electrically isolate and structurally support the transistor gates from other conductive layers (not shown) in the semiconductor structure 10.

In complementary semiconductor structures, such as CMOS, dual-doped polycrystalline silicon is used to simultaneously form p-channel and n-channel devices. Particularly, an SRAM cell uses a single polycrystalline line to form a gate electrode for both the pull-up device and the pull-down device. This single polycrystalline line is dual-doped with both acceptor impurities and donor impurities shown as portions 10A, B in FIG. 1A.

The n-type polycrystalline silicon strip 10A abuts against the p-type polycrystalline silicon strip 10B. As explained hereinbefore, a diode may undesirably form from the semiconductor/semiconductor contact of the n-type polycrystalline silicon strip 10A and the p-type polycrystalline silicon strip 10B. However, for CMOS SRAM cells ohmic contact (i.e., semiconductor/metal contact) is desired. Should a voltage of an appropriate magnitude and polarity be accidentally placed between the n-type polycrystalline silicon strip 10A and the p-type polycrystalline silicon strip 10B, current may undesirably flow.

One solution is to use a salicide process to strap a conductive stack 13 on top of the n-type polycrystalline silicon strip 10A and the p-type polycrystalline silicon strip 10B. This conductive stack 13 shorts the two types of polycrystalline silicon strips 10A, B so they are at the same potential. Therefore, undesirable current cannot flow, so the net current between the two types of polycrystalline silicon strips 10A, B is zero. The conductive stack 13 comprises a tungsten layer 9 that overlies a tungsten nitride layer 11. Other conductive (stack) materials, such as tungsten silicide or cobalt silicide, are also used.

One of the problems with this approach is that the conductive stack 13 may promote cross-diffusion. Cross-diffusion occurs when impurities from one type of polycrystalline silicon diffuse up to the conductive stack 13 and diffuse down to the other type of polycrystalline silicon. This movement of impurities undesirably transforms the designed semiconductor characteristic of the polycrystalline silicon. Another problem is that certain conductive materials may decompose during processing, which forms an undesired nonconductive layer that may degrade performance of a semiconductor device. For example, the tungsten layer 9 must be used with the tungsten nitride layer 11, but the tungsten nitride layer 11 may react with either of the polycrystalline silicon strips 10A, B to form silicon nitride, which is a nonconductive compound. This nonconductive compound may increase the vertical resistance of the gate stack 15, and thereby, may degrade the speed at which a semiconductor device that includes the gate stack 15 can operate. To avoid this increase in the vertical resistance, some semiconductor manufacturers have supplanted the use of the tungsten layer 9 and the tungsten nitride layer 11 with a layer of cobalt silicide, tungsten silicide, or titanium silicide, but in so doing, one problem is replaced with another problem. The cobalt silicide may increase the horizontal resistance of the gate stack 15 compared to the tungsten layer 9, and once again, the operational speed of the semiconductor device using the gate stack 15 may be degraded.

If the operational speed of the semiconductor devices is degraded, the operational speed of circuits that are built from these semiconductor devices may be degraded as well. However, certain circuits often need to quickly process signals, such as timing, address, and data. Without the means to solve the problems discussed above, the operational speed of these semiconductor devices may be less than desired, which may lead to their eventual lack of acceptance in the marketplace. Thus, there is a need for structures and methods to enhance semiconductor structures to inhibit cross-diffusion and decrease vertical and horizontal resistance so that semiconductor devices, which are built upon these semiconductor structures, may operate at high speed.

SUMMARY OF THE INVENTION

One illustrative aspect includes a method for strapping a gate structure of a transistor in a periphery area of a semiconductor structure. The method includes forming from a nonconductive stack a trench that superjacently abuts along a substantially length of a dual-doped polycrystalline silicon line having a p-type strip abutting an n-type strip. The nonconductive stack includes a stopping layer that stops an etching process once etched away to define the bottom of the trench. The method further includes filling the trench with a conductive substance to strap the dual-doped polycrystalline silicon line. The trench has a large cross-sectional area to decrease a horizontal resistance of the transistor so as to increase the performance of the transistor.

BRIEF DESCRIPTION OF THE DRAWINGS

FIG. 9 is a block diagram of a computer system according to one embodiment of the present invention.

DETAILED DESCRIPTION OF THE INVENTION

Figure 1A:
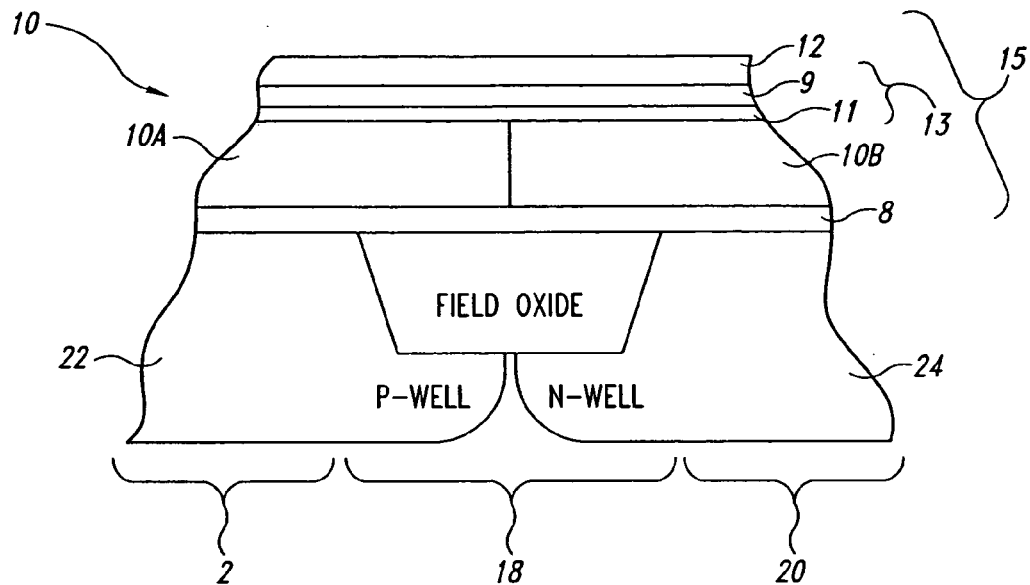
FIGS. 1A–1B are cross-sectional views of a conventional semiconductor structure.
Figure 1B:
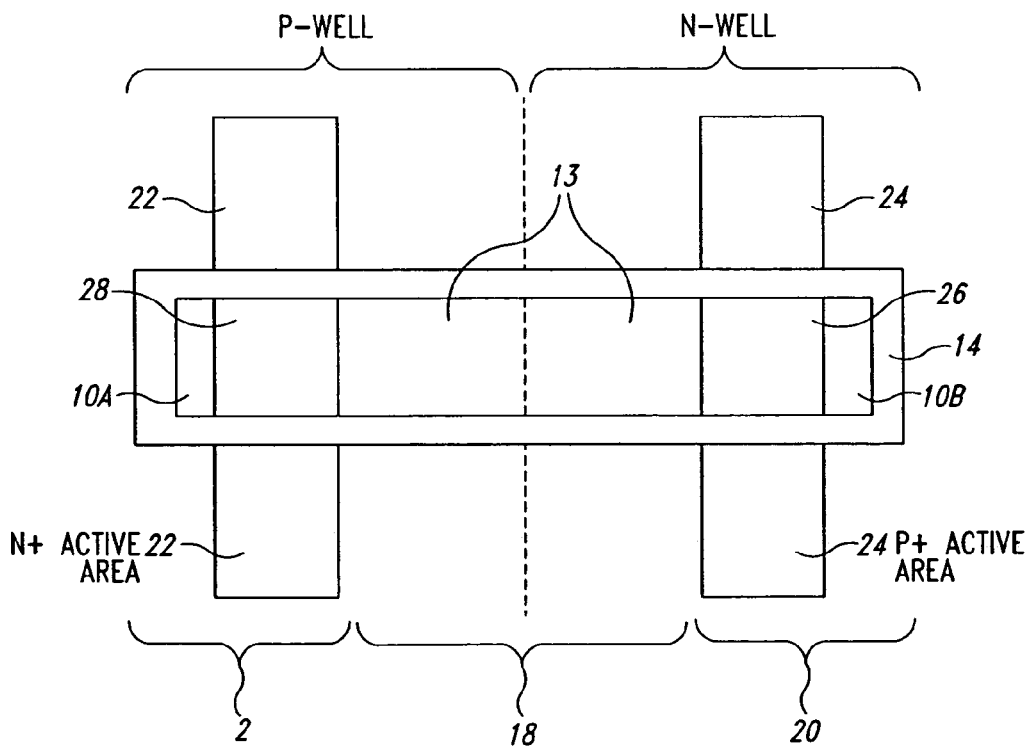

In the following detailed description of various embodiments of the invention, reference is made to the accompanying drawings, which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, electrical, and other changes may be made without departing from the spirit or scope of the present invention. The following detailed description is, therefore, not to be taken in a limiting sense.

Figure 2:
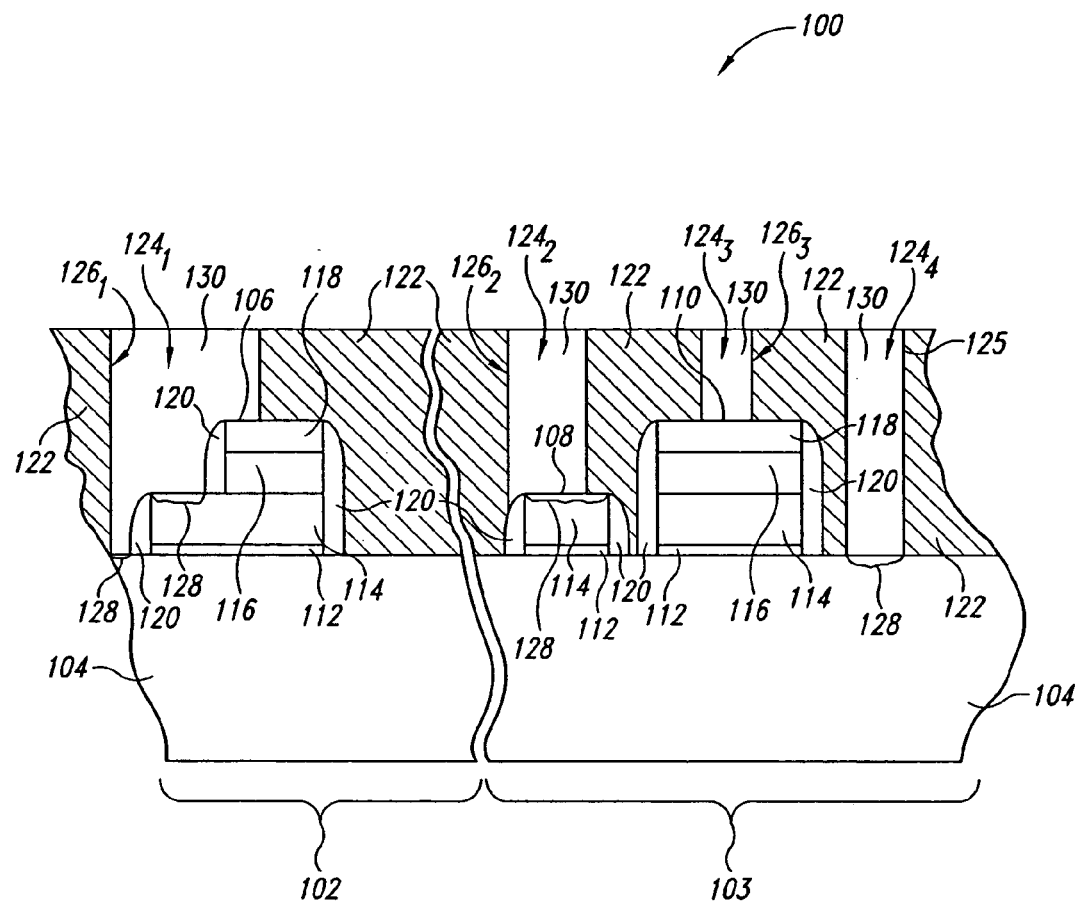
FIG. 2 is a cross-sectional view of a semiconductor structure according to one embodiment of the present invention.

A semiconductor structure, such as a memory device, may have both an array of memory cells and peripheral circuits. The array of memory cells store information, and may be referred to as an array or a storage aspect. The array may require high density so that a large amount of information may be stored within a limited amount of space. The peripheral circuits often need to quickly process signals, such as timing, address, and data, so as to access the array to read or to write information. Such peripheral circuits may be referred to as a periphery or a logic aspect of a memory device. The periphery may require high speed to keep up with the demand of a fast central processing unit. Thus, both high speed and high density are desired for memory devices. FIG. 2 is a cross-sectional view of a semiconductor structure 100 illustrating both the array and the periphery according to one embodiment of the present invention.

The semiconductor structure 100 may represent a portion of a memory device, such as a static RAM (SRAM) module. The semiconductor structure 100 includes a high-density area, which may be part of an array 102, and a high-speed area, which comprises peripheral circuitry, and may be referred to collectively as a periphery 103. The array 102 includes a number of devices, such as memory cells, that coexist in close proximity with each other. For brevity purposes, only one device, which is represented by a gate structure 106, is shown in the array 102. The periphery 103 also includes a number of devices that operate at high speed, such as timing circuits and decoders. For brevity purposes, two devices, which are represented by a gate structure 108 and a gate structure 110, are shown in the periphery 103.

Gate structures 106, 108, and 110 in the array 102 and the periphery 103 are built upon a substrate 104. The substrate 104 includes active areas, which are highly doped regions that form sources and drains, and inactive areas, which are field regions. For clarity purposes, the active and inactive areas are not shown so as to focus on the gate structures 106, 108, and 110. The gate structures 106, 108, and 110 each include a gate oxide layer 112, a polycrystalline silicon layer 114, a conductive layer 116, a gate cap layer 118, and spacers 120. A nonconductive layer 122, such as borophosphorus silicate glass (BPSG), isolates the gate structures of the devices 106; 108, and 110.

A metallization layer, which is identified collectively by numerical nomenclatures $124_1$, $124_2$, $124_3$, and $124_4$, fills a number of openings, such as openings $126_1$, $126_2$, and $126_3$, that open to certain portions of gate structures 106, 108, and 110, including a via 125. The metallization layer $124_1$, acts as a local interconnect to electrically couple an active portion of the substrate 104, such as a drain or a source, to the polycrystalline silicon layer 114. The metallization layer $124_2$ acts as a strap to the polycrystalline silicon layer 114. The metallization layer $124_3$ acts as a routing for a conductive path that overlies the gate structure 110. The metallization layer $124_4$ allows access to another active portion of the substrate 104, such as a drain or a source, by way of the via 125.

The openings $126_1$, $126_2$, and $126_3$ are formed using a suitable high-density fabrication technique. One suitable technique includes a self-aligned contact (SAC) etching technique. In the array 102, this technique builds high-density semiconductor devices, such as memory cells. In the periphery 103, this technique provides a generous margin to form the metallization layer $124_2$ which straps to certain areas in the polycrystalline silicon layer 114.

Each of the metallization layers $124_1$, $124_2$, $124_3$, and $124_4$ includes several layers, such as a silicide layer 128, a conductor layer 130, and/or a barrier layer (not shown). The silicide layer 128 lowers the vertical resistance of a metal/semiconductor junction, which is a contact point between one of the metallization layers and a gate, source, or drain of a transistor. The conductor layer 130 may be formed from a substance that lowers the horizontal resistance; this substance includes a refractory metal, such as tungsten. Depending on the substance chosen for the conductor layer 130, a barrier layer may be formed so as to inhibit undesired diffusion among the several layers of the metallization layers $124_1$, $124_2$, $124_3$, and $124_4$.

Figure 3A:
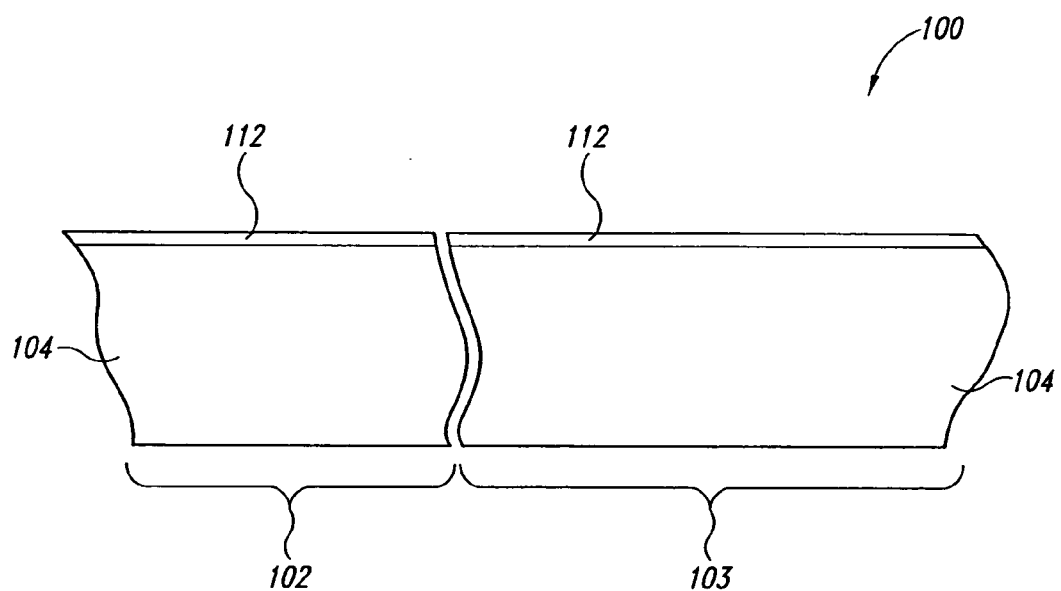
FIGS. 3A–3P are cross-sectional views of a semiconductor structure during processing according to various embodiments of the present invention.
Figure 3B:
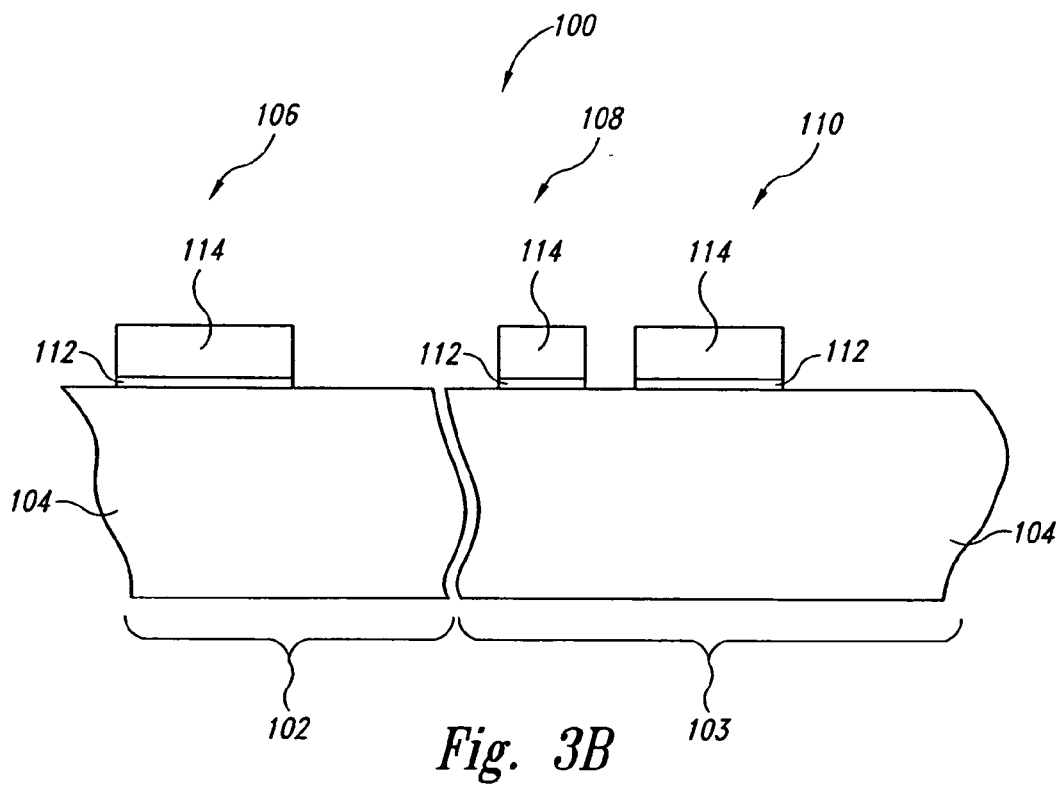
Figure 3C:
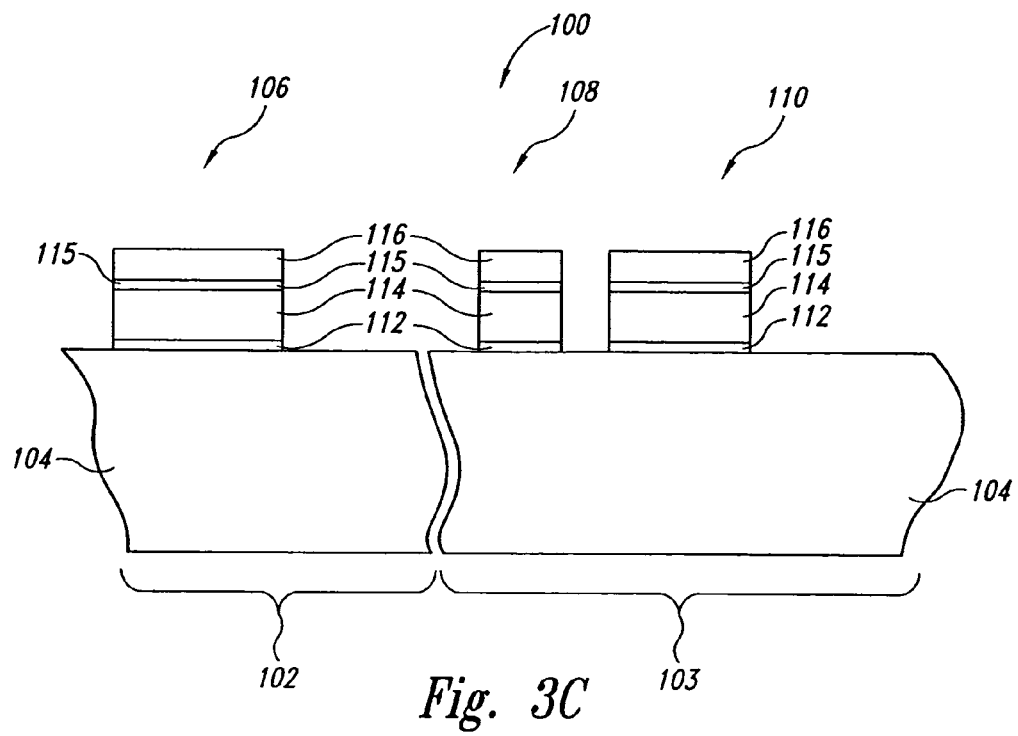
Figure 3D:
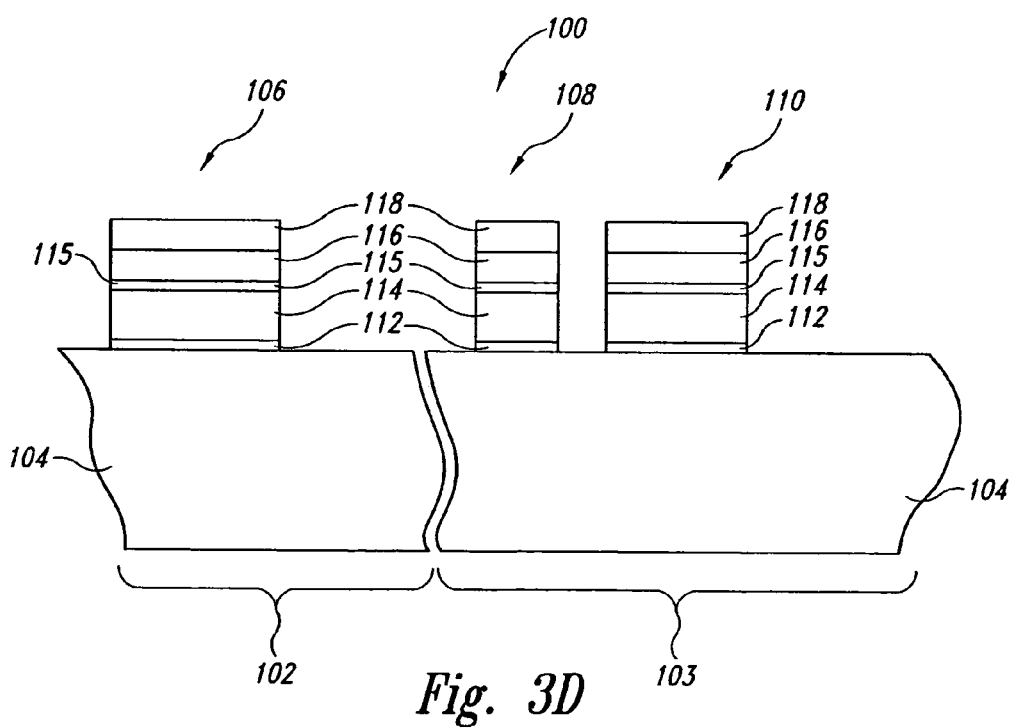
Figure 3E:
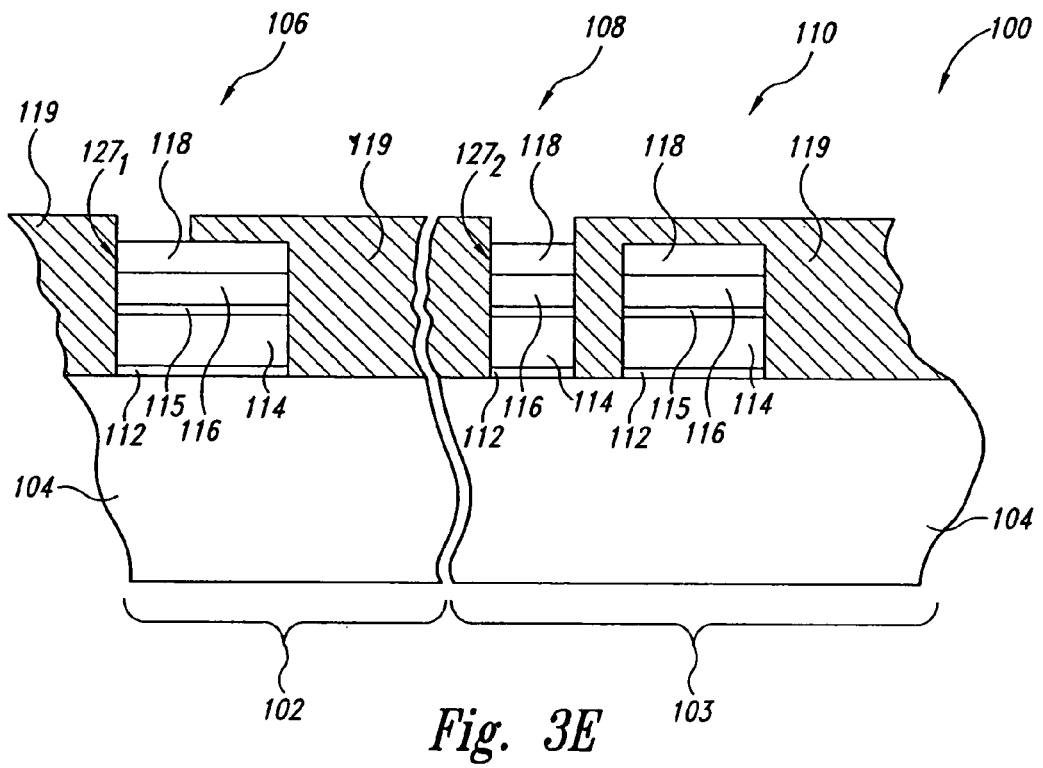
Figure 3F:
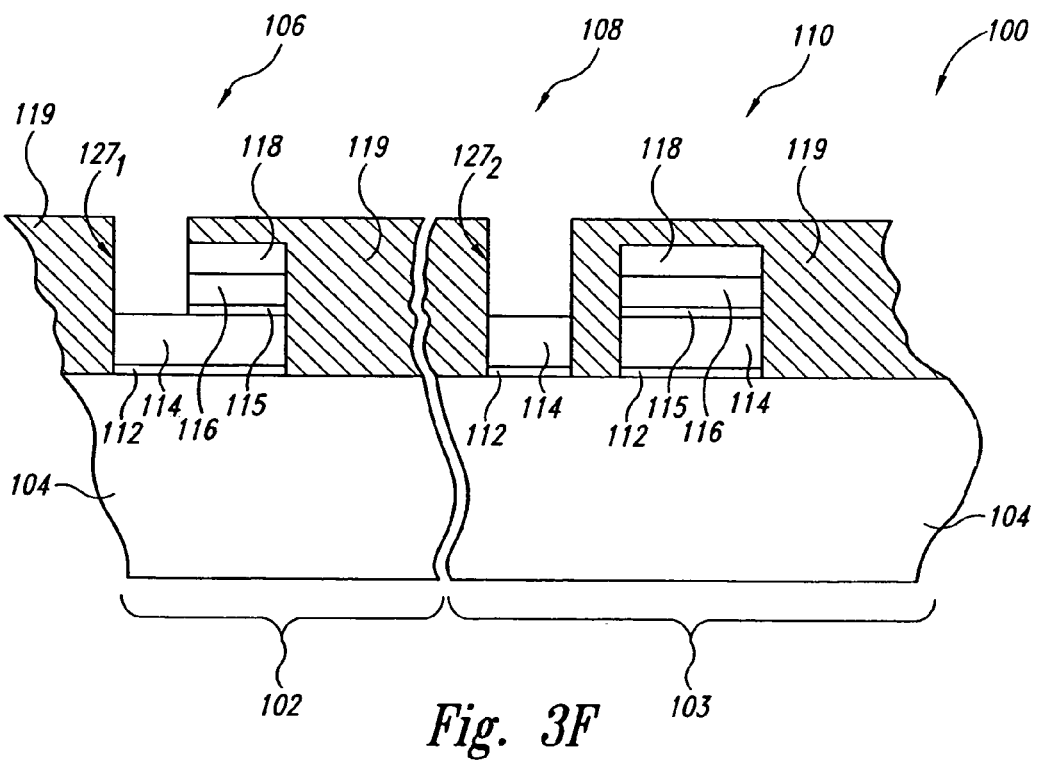
Figure 3G:
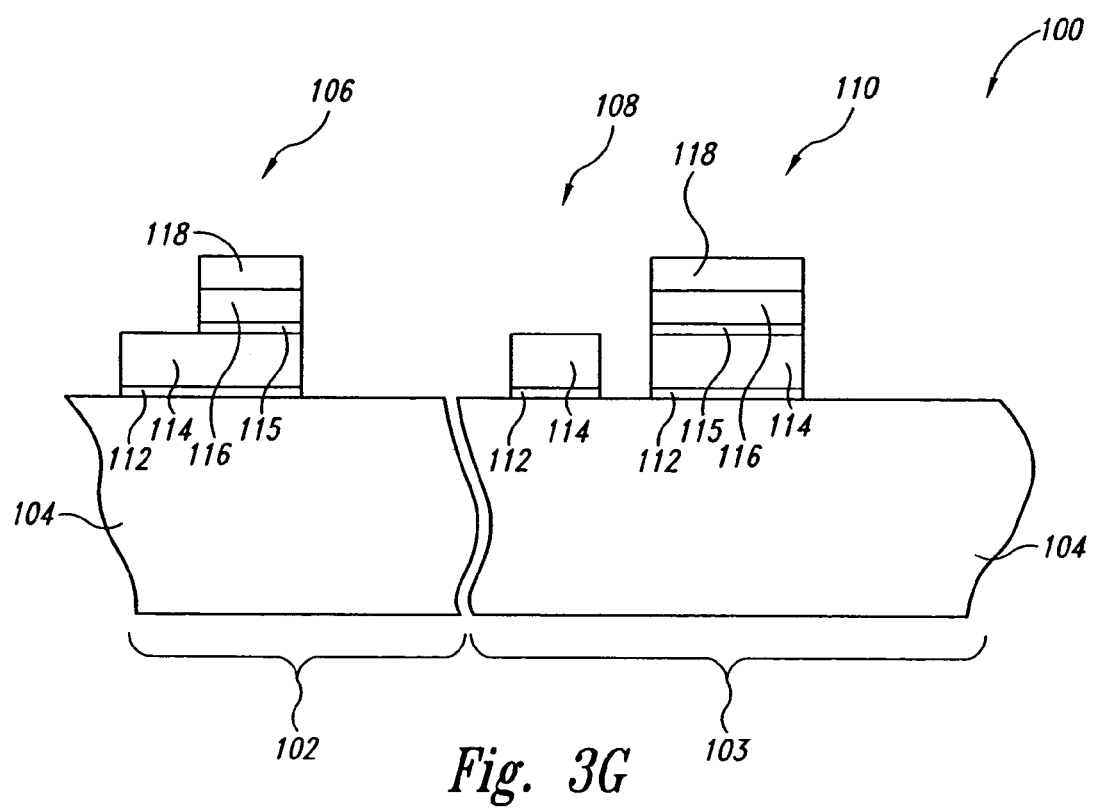
Figure 3H:
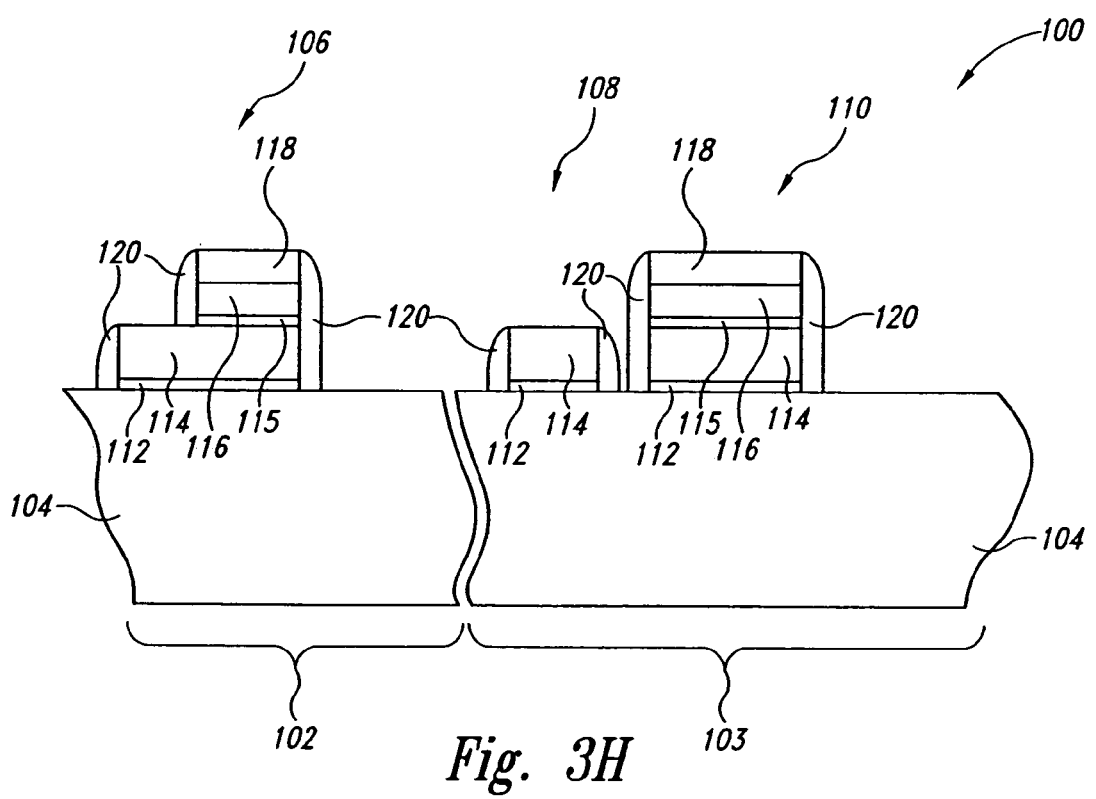
Figure 3I:
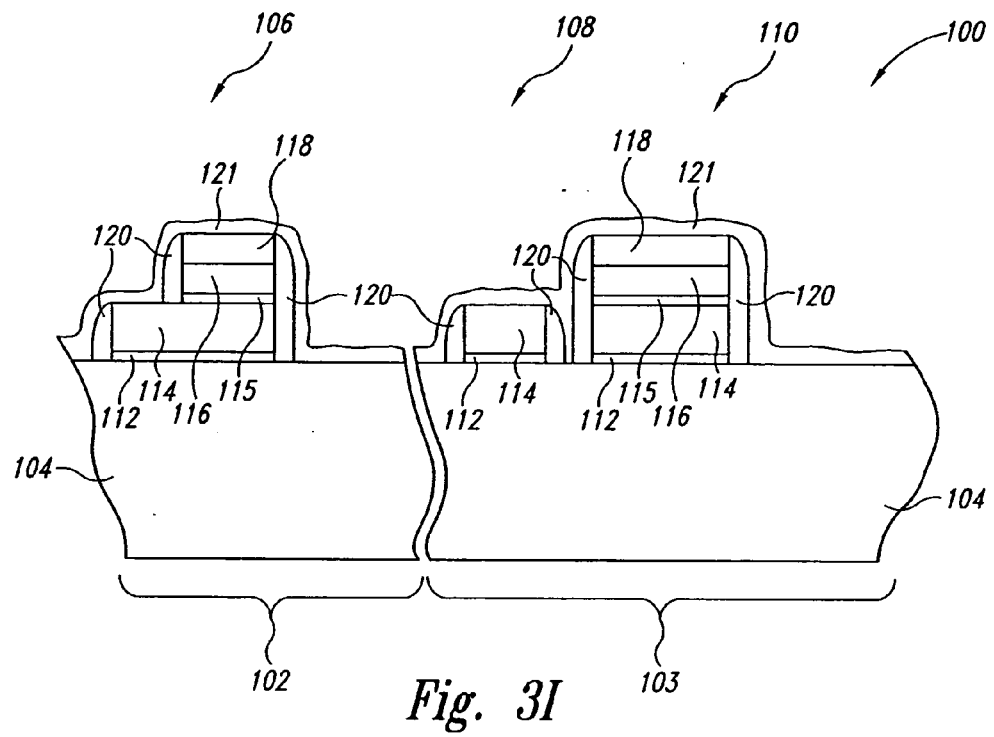
Figure 3J:
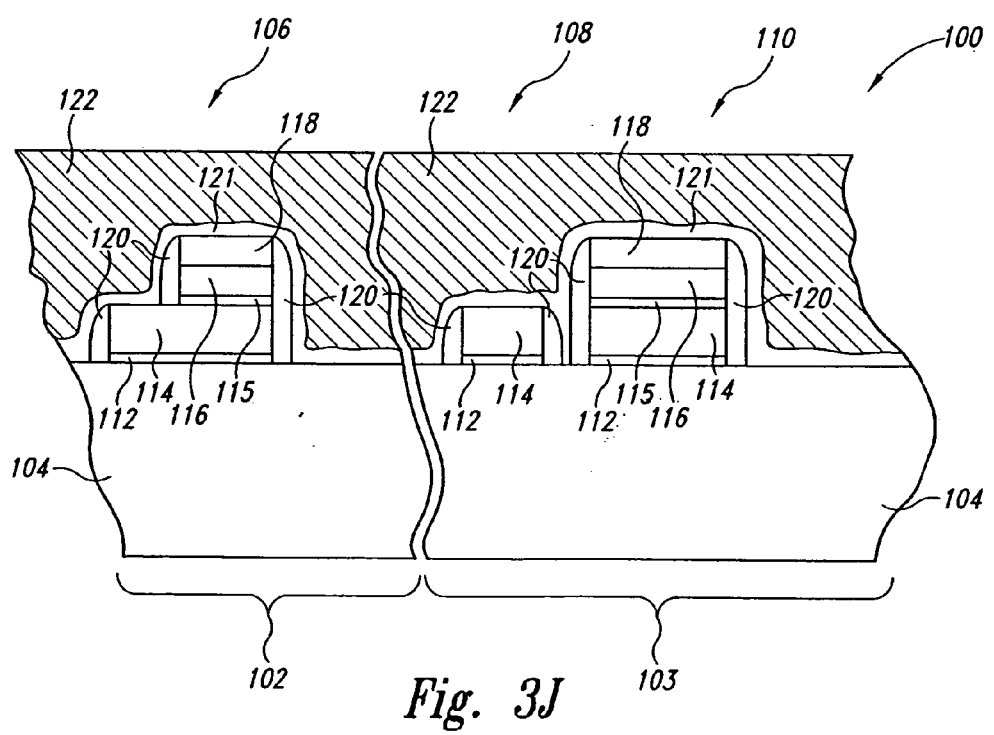
Figure 3K:
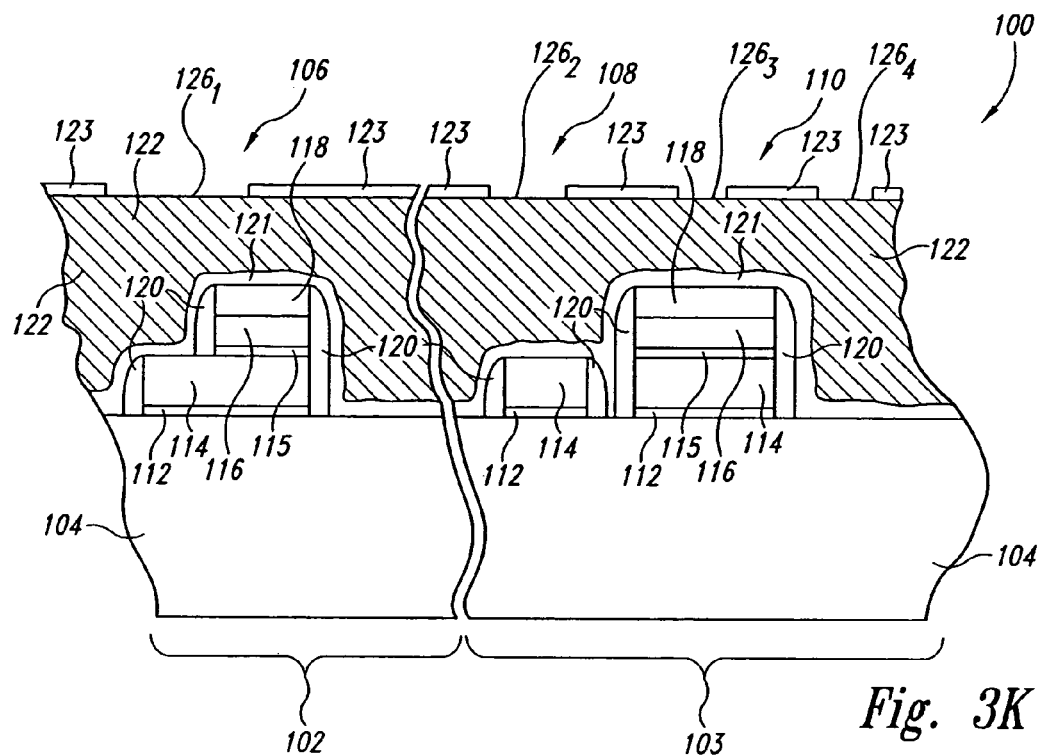
Figure 3L:
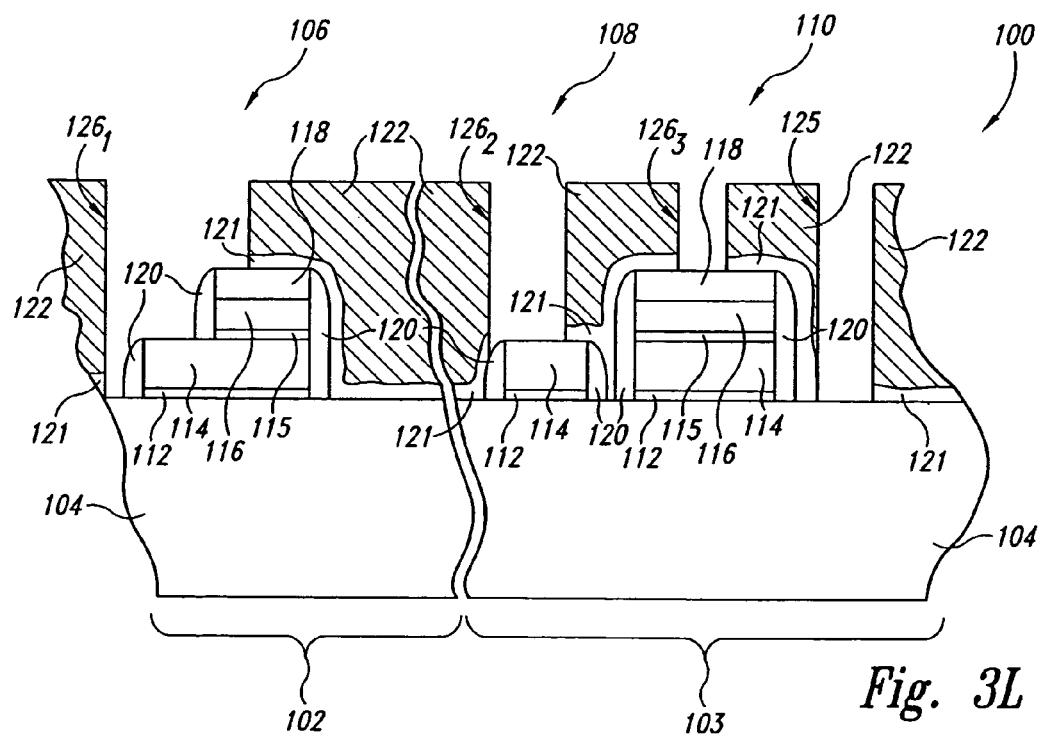
Figure 3M:
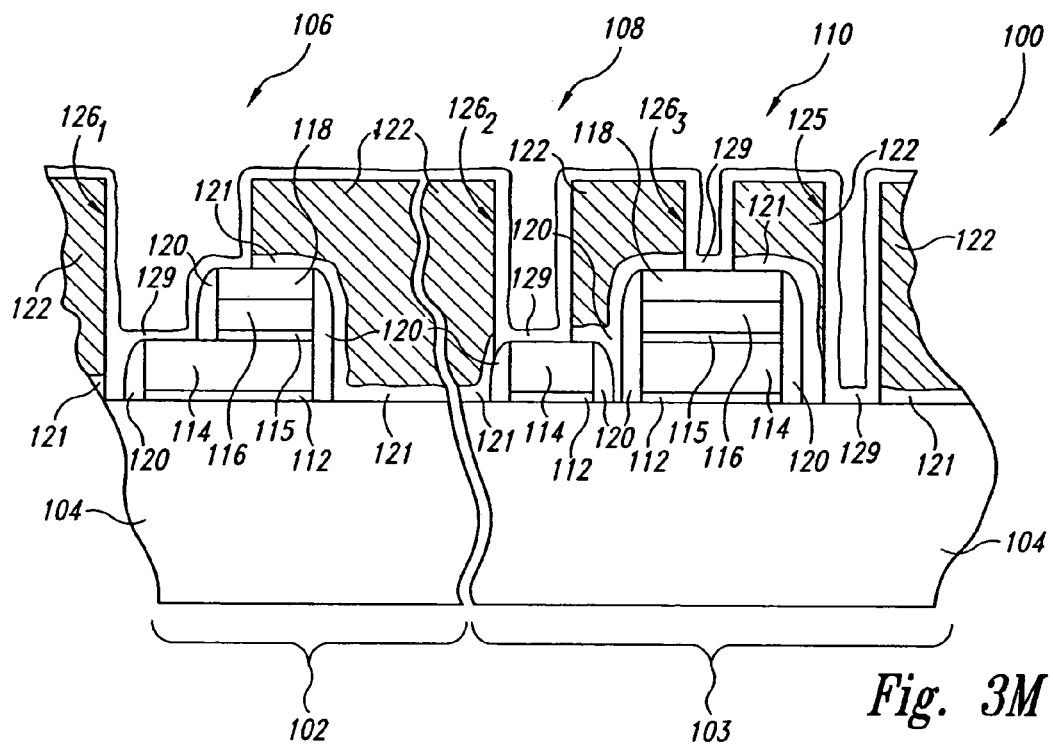
Figure 3N:
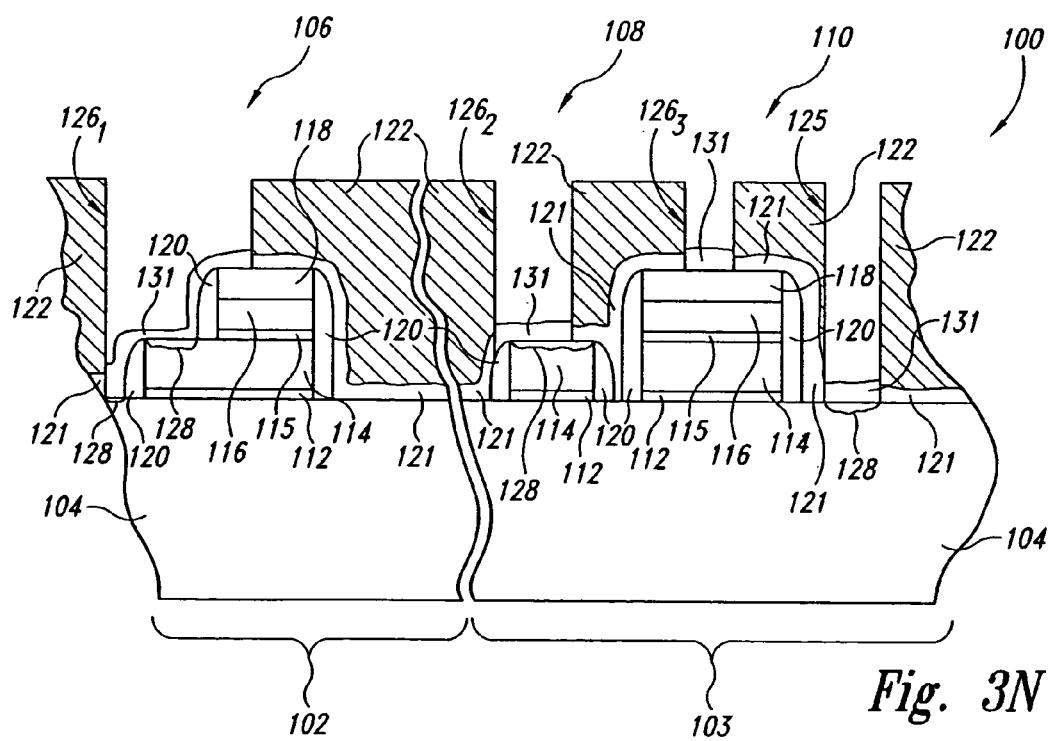
Figure 3O:
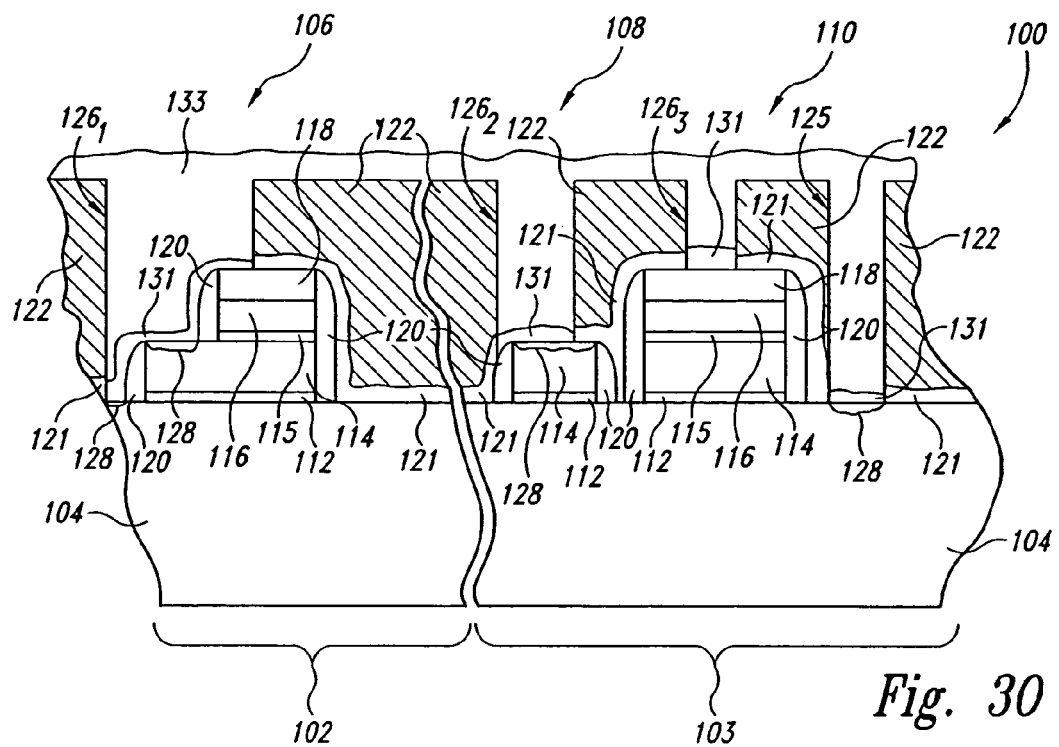
Figure 3P:
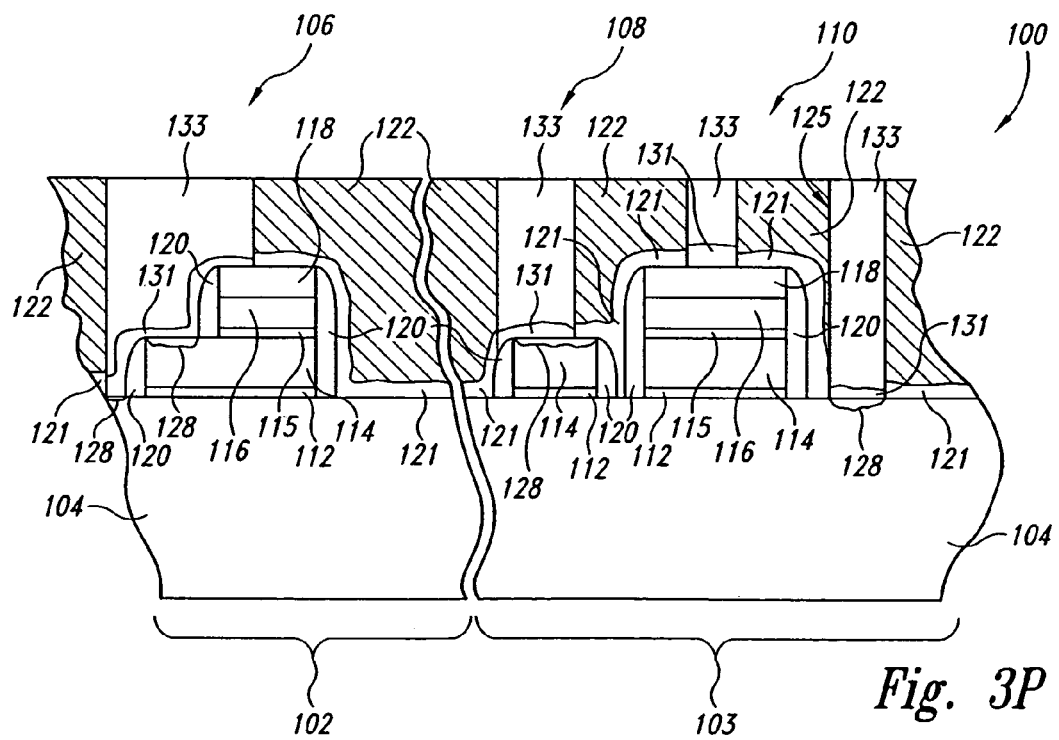

FIGS. 3A–3P are cross-sectional views of the semiconductor structure 100 during processing according to one embodiment of the present invention. The discussion in FIGS. 3A–3P illustrates a few of the steps associated with a fabrication process. The entire fabrication process is not discussed so as to focus on the embodiments of the present invention. Other methods of fabrication are also feasible and perhaps equally viable. For clarity purposes, many of the reference numbers, once discussed, may be eliminated from subsequent drawings so as to provide greater emphasis on the portion of interest of the semiconductor structure 100.

FIG. 3A is a cross-sectional view of the semiconductor structure 100 during processing according to one embodiment of the present invention. The gate oxide layer 112 is grown over the substrate 104 and covers the array 102 as well as the periphery 103. Any suitable technique can be used to grow the gate oxide layer 112. One suitable technique includes exposing the substrate 104 to dry oxygen at 900 degrees Celsius for one hour, which is followed by an annealing process in argon for 30 minutes.

Other processing steps may be applied prior to or after the formation of the gate oxide layer 112, but these steps do not limit the embodiments of the present invention, and thus, are not shown so as to focus on the embodiments of the present invention. Briefly, the substrate 104 can be formed from any suitable substances and compounds, such as lightly doped n-type or p-type material or a lightly doped epitaxial layer on a heavily doped substrate. Field oxide may be deposited, patterned, and etched on the substrate 104 so as to define non-active areas of the substrate 104.

FIG. 3B is a cross-sectional view of the semiconductor structure 100 during the next sequence of processing according to one embodiment of the present invention. A polycrystalline silicon layer 114 is deposited over the semiconductor structure 100 after the gate oxide layer 112 is formed. This polycrystalline silicon layer 114 is photolithographed and is etched at selected areas on the substrate 104 to form gate structures in the array 102 and the periphery 103. The etching process etches away not only portions of the polycrystalline silicon layer 114 but also portions of the gate oxide layer 112 to define the beginning of gate structures 106, 108, and 110.

Other processing steps may be applied prior to or after the formation of the polycrystalline silicon layer 114, but these steps do not limit the embodiments of the present invention, and thus, are not shown so as to focus on the embodiments of the present invention. For example, impurities of the appropriate kind are implanted into the source and drain areas so as to form highly doped regions that provide a reservoir of majority carriers for the conduction of holes or electrons. Reoxidation of the source and drain areas to pattern gate areas may follow the implantation step.

Any suitable technique may be used to deposit the polycrystalline silicon layer 114. One suitable technique includes chemical-vapor deposition. Any suitable technique may be used to etch the polycrystalline silicon layer 114 and the gate oxide layer 112. One suitable technique includes a plasma etching technique. Other deposition techniques and etching techniques may be used without limiting the embodiments of the present invention.

FIG. 3C is a cross-sectional view of the semiconductor structure 100 during the next sequence of processing according to one embodiment of the present invention. A conductive layer 116 is deposited, photolithographed, and etched over the semiconductor structure 100 to provide a number of metal/semiconductor junctions to gate structures 106, 108, and 110. These junctions allow electrical access to the gate structures 106, 108, and 110. In other words, these junctions allow word lines to be electrically coupled to the gate structures 106, 108, and 110.

If the conductive layer 116 has a high likelihood of diffusing to the polycrystalline silicon layer 114, a barrier layer 115 can be used to inhibit the diffusion. In cases where the barrier layer 115 is needed, the barrier layer 115 is deposited first prior to the deposition of the conductive layer 116. Any suitable deposition technique to deposit the conductive layer 116 or the barrier layer 115 may be used. One suitable technique includes sputtering. Any suitable etching technique may be used to etch the conductive layer 116 or the barrier layer 115, such as plasma etching. Suitable conductive materials include tungsten or various species of tungsten silicide. Suitable barrier materials include various species of tungsten nitride. Many other suitable conductive materials and barrier materials may be used without limiting the embodiments of the present invention.

FIG. 3D is a cross-sectional view of the semiconductor structure 100 during the next sequence of processing according to one embodiment of the present invention. A dielectric layer 118 is deposited, photolithographed, and etched to cap the gate structures 106, 108, and 110. A suitable dielectric material includes silicon dioxide, but any other suitable dielectric materials may be used. A suitable deposition technique includes chemical-vapor deposition and a suitable etching technique includes plasma etching. Other suitable deposition and etching techniques may be used without limiting the embodiments of the present invention.

FIG. 3E is a cross-sectional view of the semiconductor structure 100 during the next sequence of processing according to one embodiment of the present invention. The semiconductor structure 100 undergoes a photolithography process to simultaneously expose desired areas in the array 102 and the periphery 103. More particularly, the photolithography process exposes a portion of the gate structure 106, which is in the array 102, and a portion of the gate structure 108, which is in the periphery 103, so that openings $127_1$ and $127_2$ may be formed at a desired depth into these gate structures. In one embodiment, the photolithography process exposes at least the opening $127_2$.

The opening $127_1$ into the portion of the gate structure 106 helps to exhume contact with the polycrystalline silicon layer 114. The opening $127_2$ into the portion of the gate structure 108 allows the polycrystalline silicon layer 114 to be strapped by a metallization layer. This photolithography process contributes to economizing the formation of openings $127_1$ and $127_2$ in both the array 102 and the periphery 103, which will be discussed hereinbelow in other Figures.

The photolithography process deposits a resist layer 119. This resist layer 119 is exposed to ultraviolet light through a mask, and the exposed regions are dissolved by a developing solution. The remaining resist layer 119 serves as a mask for etching to form openings $127_1$ and $127_2$ into gate structures 106 and 108.

FIG. 3F is a cross-sectional view of the semiconductor structure 100 during the next sequence of processing according to one embodiment of the present invention. The semiconductor structure 100 is etched to remove exposed portions of the gate structures 106 and 108 so that openings $127_1$ and $127_2$ are formed. Thus, the etching process may remove portions of the dielectric layer 118, conductive layer 116, and/or barrier layer 115. A portion of the resist layer 119 that was not removed by the developing solution remains to serve as a mask to guide the etching process. One suitable etching process includes a dry-etch technique, such as plasma, ion milling, or reactive ion etching.

FIG. 3G is a cross-sectional view of the semiconductor structure 100 during the next sequence of processing according to one embodiment of the present invention. The resist 119 that serves as a mask to guide the etching process in FIG. 3F is stripped using any suitable stripping technique. One suitable technique includes a wet chemical stripping technique using sulfuric acid and oxidant solutions. Another suitable technique includes a dry stripping technique, such as a plasma process.

FIG. 3H is a cross-sectional view of the semiconductor structure 100 during the next sequence of processing according to one embodiment of the present invention. A thick oxide layer 120 is deposited over the semiconductor structure 100 and anisotropically etched away to leave only the sidewall spacers as shown in the FIG. 2H. One suitable deposition technique to deposit the thick oxide layer includes a low-temperature chemical-vapor deposition technique.

FIG. 3I is a cross-sectional view of the semiconductor structure 100 during the next sequence of processing according to one embodiment of the present invention. An etch stopping layer 121 is deposited over the semiconductor structure 100 as shown in FIG. 3I. The next time the semiconductor structure 100 undergoes an etching process, the etching process will etch away the stopping layer 121, but in so doing, the etching process will cease from removing any other layers subjacent the stopping layer 121.

The stopping layer 121 may be deposited using a suitable material, such as a dielectric liner. The dielectric liner can be chosen from silicon dioxide, which is derived from tetraethylorthosilicate (TEOS). Any suitable deposition technique may be used, such as hot-wall low-pressure chemical-vapor deposition. Another suitable material is a dielectric-antireflective-coating (DARC) compound, such as inorganic silicon oxynitride (SiON), which can be deposited using a suitable technique, such as plasma-enhanced chemical-vapor deposition (PECVD).

FIG. 3J is a cross-sectional view of the semiconductor structure 100 during the next sequence of processing according to one embodiment of the present invention. A layer of borophosphosilicate glass (BPSG) 122 is deposited over the semiconductor structure 100 to provide mechanical protection and electrical isolation for gate structures 106, 108, and 110. One suitable deposition technique includes chemical-vapor deposition.

FIG. 3K is a cross-sectional view of the semiconductor structure 100 during the next sequence of processing according to one embodiment of the present invention. The semiconductor structure 100 undergoes a photolithography process in which a resist layer 123 is deposited and is exposed to ultraviolet light through a mask. The exposed regions are dissolved by a developing solution. The remaining resist layer 123 that is still attached to the semiconductor structure 100 after developing serves as a mask. The mask is used to expose certain areas of the semiconductor structure 100 for etching to form openings $126_1$, $126_2$, $126_3$, and $126_4$ as will be explained with respect to FIG. 3L.

FIG. 3L is a cross-sectional view of the semiconductor structure 100 during the next sequence of processing according to one embodiment of the present invention in which the semiconductor structure 100 undergoes an etching process to form openings $126_1$, $126_2$, $126_3$, and $126_4$. The portions of the resist layer 123 that were not removed by the developing solution remain to serve as a mask to guide the etching process to form openings $126_1$, $126_2$, $126_3$, and $126_4$. Thus, the etching process may remove portions of the BPSG layer 122 and the stopping layer 121 to stop at the dielectric layer 118, polycrystalline silicon layer 114, or the substrate 104. One suitable etching process includes a dry-etch technique, such as plasma, ion milling, or reactive ion etching.

After the formation of the openings $126_1$, $126_2$, $126_3$, and $126_4$, the resist layer 123 that serves as a mask to guide the etching process is stripped using any suitable stripping technique. One suitable technique includes a wet chemical stripping technique using sulfuric acid and oxidant solutions. Another suitable technique includes a dry stripping technique, such as a plasma process. The result of the etching and stripping processes is shown in FIG. 3L.

The opening $126_1$ creates a local interconnect between a portion of the gate structure 106 and a highly doped area (not shown) in the polycrystalline silicon layer 114. The opening $126_2$ allows the polycrystalline silicon layer 114 to be strapped by a metallization layer if the polycrystalline silicon layer is a dual-doped polycrystalline silicon layer used for complementary semiconductor structures, such as complementary-metal-oxide semiconductor (CMOS) devices. The opening $126_3$ allows local routing over the gate structure 110. The opening $126_4$ allows electrical access to a highly doped area of the substrate 104. This photolithography process economizes the formation of openings $126_1$, $126_2$, and $126_3$ in both the array 102 and the periphery 103 so that the embodiments of the present invention may provide a metallization layer, which will be discussed hereinbelow in other Figures, to enhance high-speed operation, support high-density devices, and inhibit undesired cross-diffusion.

In the idiom of semiconductor processing, the sequence of processing as discussed in FIGS. 3K–3L is called a self-aligned contact (SAC) etching technique. This SAC etching technique takes advantage of the fact that memory cells have similar features, which allows them to be produced with a high density. Although this SAC etching technique has been adopted by the semiconductor manufacturers to increase density in the array, they have refrained from using it to fabricate circuitry in the periphery, which comprises high-speed devices, because they believe that the process adds too much complexity. The embodiments of the present invention recognize that not only this technique can be used to build the high-density array 102 but it can also be used to extend into the high-speed periphery 103 to create various openings for metallization. One way that the SAC etching technique helps to increase performance is to allow a thicker metallization layer (or larger cross-sectional area) to be deposited into the opening $126_2$ to strap the polycrystalline silicon layer 114. Because horizontal resistivity is inversely proportional to the cross-sectional area, this increase in the cross-sectional area helps to increase performance.

FIG. 3M is a cross-sectional view of the semiconductor structure 100 during the next sequence of processing according to one embodiment of the present invention. A conductive layer 129 is deposited over the semiconductor structure 100, which can be reacted with to form a silicide compound in exposed regions of polycrystalline silicon or highly doped areas of the substrate 104. The silicide compound helps to reduce vertical resistance that may exist in vertically oriented gate structures, such as gate structures 106, 108, and 110. The conductive layer 129 includes a number of substances, such as platinum, molybdenum, cobalt, and titanium.

The discussion in FIG. 3M is better understood by explaining the physics by which the silicide compound helps to reduce vertical resistance. To access a semiconductor device, a metal/semiconductor junction is formed so that a contact can be made. Unlike a semiconductor/semiconductor junction, such as exists in a diode, a metal/semiconductor junction may present a potential barrier that affects the transport of charges, and hence, impairs the ability of the semiconductor device to operate at high speed. To increase the speed, this potential barrier should be lowered. One technique to lower this potential barrier is to form a silicide layer that interfaces between the metal and the semiconductor. This silicide layer lowers the work function so as to ease the ability of the electrons to move across the metal/semiconductor junction.

One benefit of the technique as described in FIG. 3M is that the conductive layer 129 is simultaneously deposited throughout desired sections in both the array 102 and the periphery 103, where a silicide compound 128 as best shown in FIG. 3N can be formed. The silicide compound 128 not only helps to facilitate high-speed operation in the periphery area 103, such as in the conduction of carriers in the via 125, but is also a part of a local interconnect material used in the array area 102, such as in the opening $126_1$.

FIG. 3N is a cross-sectional view of the semiconductor structure 100 during the next sequence of processing according to one embodiment of the present invention in which a barrier layer 131 is optionally deposited. A barrier layer 131 inhibits the undesired diffusion of metal atoms into a silicon crystal structure. One suitable technique to deposit the barrier layer includes a sputtering process. The material of the barrier layer 131 may include various species of nitrides, such as titanium nitride and tantalum nitride, or titanium-tungsten.

The conductive layer 129 is then reacted with through an annealing process to form a silicide compound 128 throughout the array 102 and the periphery 103. The conductive layer 129 may undergo the annealing process at this step, or at any time before the completion of the processing of the semiconductor structure 100. The remaining unreacted conductive layer 129 is then removed. The result is as shown in FIG. 3N. In other cases, the unreacted conductive layer is left on the wafer surface, which is followed by deposition of a conductive barrier layer before depositing the conductive layer 133.

FIG. 3O is a cross-sectional view of the semiconductor structure 100 during the next sequence of processing according to one embodiment of the present invention. A conductive layer 133 is deposited over both the array 102 and the periphery 103. The conductive layer 133 is chosen from a substance that can be used simultaneously for a variety of purposes: as a local interconnect in the openings $126_1$ for the gate structure 106 in the array 102; as a strap in the openings $126_2$ for the gate structure 108 in the periphery 103; as a routing conductor in the opening $126_3$ which lies over the gate structure 110 in the periphery 103; and as a plug material for the via 125. This substance also acts to reduce the horizontal resistance (sheet resistance) so as to enhance high-speed operation in the periphery 103.

The conductive layer 133 is chosen from a substance that includes a representative metal, such as aluminum; a refractory metal, such as tungsten; or a coinage metal, such as copper. Any suitable deposition technique can be used to deposit the conductive layer 133, such as sputtering.

FIG. 3P is a cross-sectional view of the semiconductor structure 100 during the next sequence of processing according to one embodiment of the present invention in which the conductive layer 133 undergoes a chemical-mechanical planarization process. The result is as shown in FIG. 3P.

Surface p-channel transistors, such as represented by gate structure 108, are compatible with the need to scale down to the smaller dimensions. Semiconductor manufacturers use both n+ and p+ polycrystalline silicon gates on the same chip so as to form these surface n-channel and p-channel transistors. The technique of using both n+ and p+ polycrystalline silicon is called a dual-doped approach, and to prevent an undesired diode from forming at the interface of the n+ and p+ polycrystalline, the n+ polycrystalline is strapped to the p+ polycrystalline. However, this technique often suffers from cross-diffusion when the semiconductor structure undergoes high temperature processing steps. The embodiments of the present invention overcome this by forming the metallization layer, which includes conductive layer 133, barrier layer 131, and silicide layer 128, near the completion of the semiconductor structure 100 so as to avoid high temperature processing steps.

Figure 4:
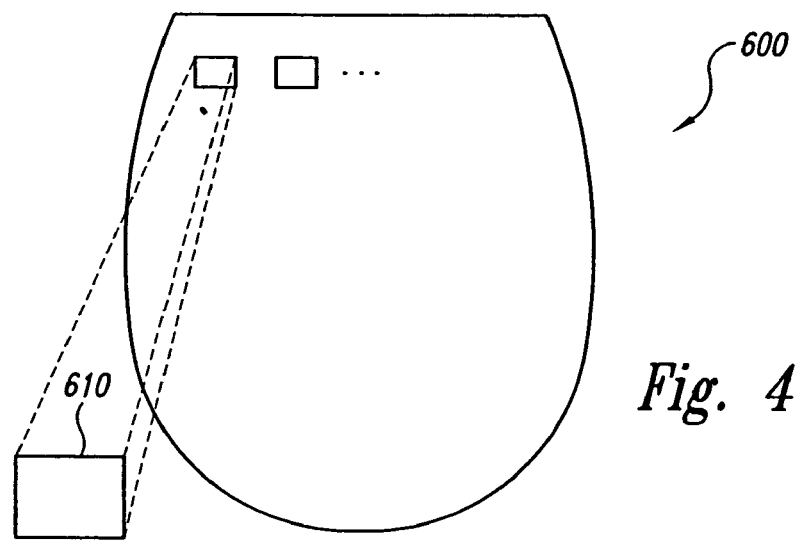
FIG. 4 is a plan view of a semiconductor wafer according to one embodiment of the present invention.

FIG. 4 is a plan view of a semiconductor wafer according to one embodiment of the present invention. In one embodiment, a semiconductor die 610 is produced from a wafer 600. A die is an individual pattern, typically rectangular, on a substrate that contains circuitry, or integrated circuit devices, to perform a specific function. At least one of the integrated circuit devices includes a semiconductor structure 100 as discussed in the various embodiments hereinbefore in accordance with the invention. A semiconductor wafer will typically contain a repeated pattern of such dies containing the same functionality. Die 610 may contain circuitry for the inventive memory device, as discussed above. Die 610 may further contain additional circuitry to extend to such complex devices as a monolithic processor with multiple functionalities. Die 610 is typically packaged in a protective casing (not shown) with leads extending therefrom (not shown) providing access to the circuitry of the die for unilateral or bilateral communication and control.

Figure 5:
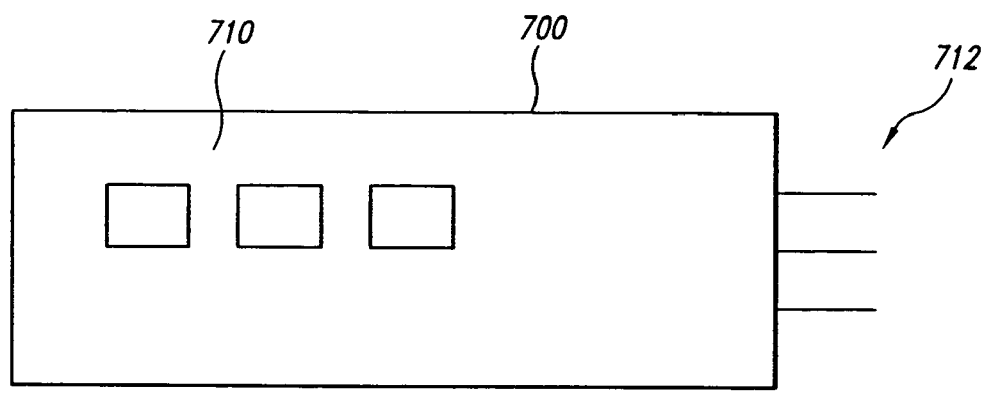
FIG. 5 is a block diagram of a circuit module according to one embodiment of the present invention.

FIG. 5 is a block diagram of a circuit module according to one embodiment of the present invention. Two or more dies 710 may be combined, with or without protective casing, into a circuit module 700 to enhance or extend the functionality of an individual die 710. Circuit module 700 may be a combination of dies 710 representing a variety of functions, or a combination of dies 710 containing the same functionality. One or more dies 710 of circuit module 700 contain at least a semiconductor structure 100 in accordance with the embodiments of the present invention.

Some examples of a circuit module include memory modules, device drivers, power modules, communication modems, processor modules, and application-specific modules, and may include multiplayer, multichip modules. Circuit module 700 may be a subcomponent of a variety of electronic systems, such as a clock, a television, a cell phone, a personal computer, an automobile, an industrial control system, an aircraft, and others. Circuit module 700 will have a variety of leads 712 extending therefrom and coupled to the dies 710 providing unilateral or bilateral communication and control.

Figure 6:
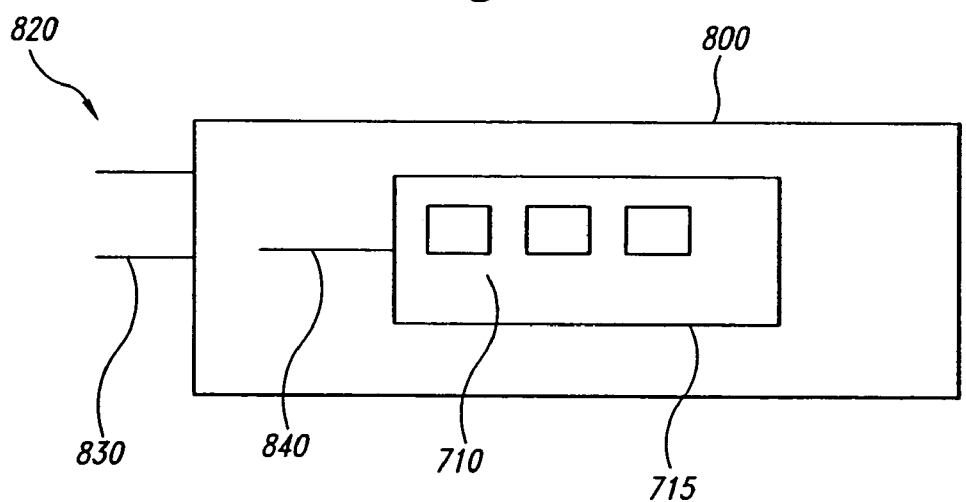
FIG. 6 is a block diagram of a memory module according to one embodiment of the present invention.

FIG. 6 is a block diagram of a memory module according to one embodiment of the present invention. Memory module 800 contains multiple memory devices 810 contained on support 815, the number depending upon the desired bus width and the desire for parity. Memory module 800 accepts a command signal from an external controller (not shown) on a command link 820 and provides for data input and data output on data links 830. The command link 820 and data links 830 are connected to leads 840 extending from the support 815. Leads 840 are shown for conceptual purposes and are not limited to the positions as shown. At least one of the memory devices 810 includes a semiconductor structure 100 as discussed in various embodiments in accordance with the invention.

Figure 7:
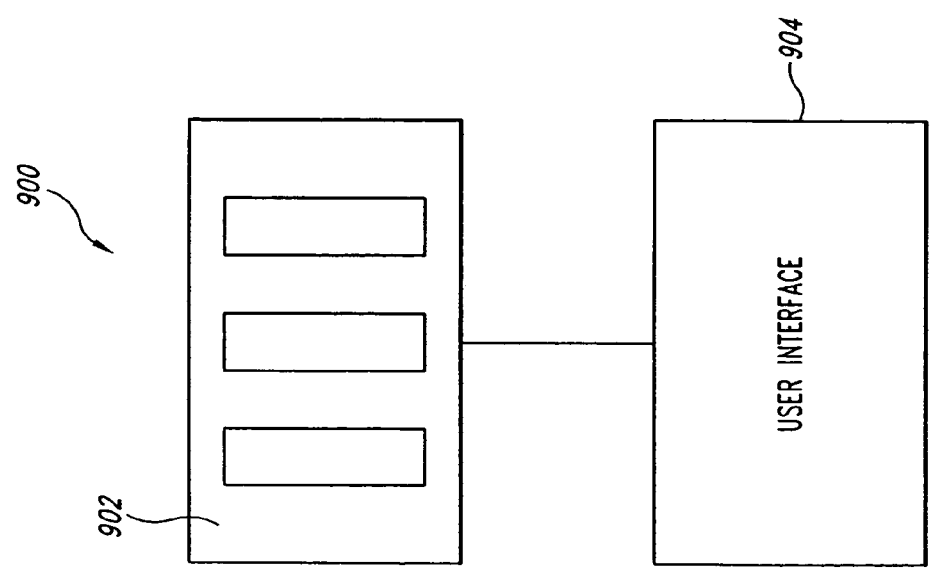
FIG. 7 is a block diagram of an electronic system according to one embodiment of the present invention.

FIG. 7 is a block diagram of an electronic system according to one embodiment of the present invention. Electronic system 900 contains one or more circuit modules 902. Electronic system 900 generally contains a user interface 904. User interface 904 provides a user of the electronic system 900 with some form of control or observation of the results of the electronic system 900. Some examples of user interface 904 include the keyboard, a pointing device, monitor, or printer of a personal computer; the tuning dial, display, or speakers of a radio; the ignition switch, gauges, or gas pedal of an automobile; and the card reader, keypad, display, or currency dispenser of an automated teller machine. User interface 904 may further describe access ports provided to electronic system 900. Access ports are used to connect an electronic system to the more tangible user interface components previously exemplified. One or more of the circuit modules 902 may be a processor providing some form of manipulation, control, or direction of inputs from or outputs to user interface 904, or of other information either preprogrammed into, or otherwise provided to, electronic system 900. As will be apparent from the lists of examples previously given, electronic system 900 will often contain certain mechanical components (not shown) in addition to circuit modules 902 and user interface 904. It will be appreciated that the one or more circuit modules 902 in electronic system 900 can be replaced by a single integrated circuit. Furthermore, electronic system 900 may be a subcomponent of a larger electronic system. At least one of the circuit modules 902 includes a semiconductor structure 100 as discussed in various embodiments in accordance with the invention.

Figure 8:
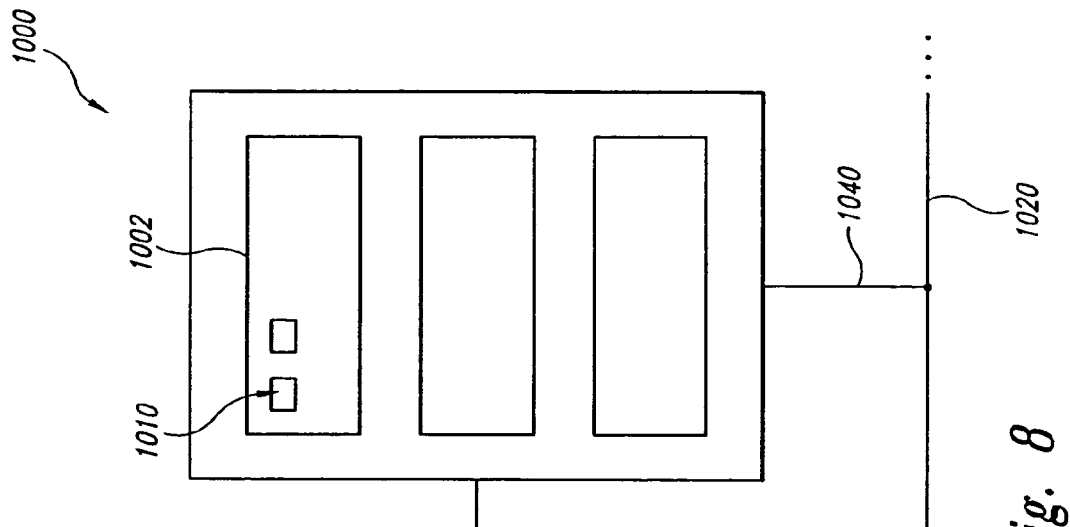
FIG. 8 is a block diagram of a memory system according to one embodiment of the present invention.

FIG. 8 is a block diagram of a memory system according to one embodiment of the present invention. Memory system 1000 contains one or more memory modules 1002 and a memory controller 1012. Each memory module 1002 includes at least one memory device 1010. Memory controller 1012 provides and controls a bi-directional interface between memory system 1000 and an external system bus 1020. Memory system 1000 accepts a command signal from the external bus 1020 and relays it to the one or more memory modules 1002 on a command link 1030. Memory system 1000 provides for data input and data output between the one or more memory modules 1002 and external system bus 1020 on data links 1040. At least one of the memory devices 1010 includes a semiconductor structure 100 as discussed in various embodiments in accordance with the invention.

FIG. 8 is a block diagram of a computer system according to one embodiment of the present invention. Computer system 1000 contains a processor 1110 and a memory system 1102 housed in a computer unit 1105. Computer system 1100 is but one example of an electronic system containing another electronic system, e.g., memory system 1102, as a subcomponent. The memory system 1102 may include a semiconductor structure 100 as discussed in various embodiments of the present invention. Computer system 1100 optionally contains user interface components. These user interface components include a keyboard 1120, a pointing device 1130, a monitor 1140, a printer 1150, and a bulk storage device 1160. It will be appreciated that other components are often associated with computer system 1100 such as modems, device driver cards, additional storage devices, etc. It will further be appreciated that the processor 1110 and memory system 1102 of computer system 1100 can be incorporated on a single integrated circuit. Such single-package processing units reduce the communication time between the processor and the memory circuit.

Devices, structures, and methods have been discussed to address a desire to have a semiconductor structure with both a high-density aspect and a high-speed aspect. The embodiments of the present invention use a SAC etching technique not only to form high-density devices but also to form openings so that a metallization layer may be deposited to lower horizontal resistance and vertical resistance to enhance high-speed operation. The embodiments of the present invention economize the manufacturing of semiconductor devices by simplifying processing steps so as to produce less expensive products for consumers.

Although the specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

We claim:

1. A method for making a semiconductor structure in a substrate having an array area and a periphery area, the method comprising:
    forming a transistor in the array area and a transistor in the periphery area;
    forming a stopping layer over the transistors in the array area and the periphery area, the stopping layer having a characteristic to stop an etching process when consumed by the etching process;
    forming over the stopping layer a nonconductive layer;
    forming openings by etching the nonconductive layer and the stopping layer, the openings exposing a polycrystalline silicon layer of the transistor in the array area and the transistor in the periphery area; and
    forming a metallization layer by filling the openings with conductive substances and compounds, the metallization layer forming a local interconnect layer for the transistor in the array area and forming a strapping layer for the transistor in the periphery area.

2. The method of claim 1, wherein forming openings includes forming openings by a self-aligned contact (SAC) etching technique.

3. The method of claim 1, wherein forming openings includes forming openings on gate structures in the high-density area to form contacts and forming openings on gate structures in the high-speed area so as to strap.

4. The method of claim 1, wherein forming a metallization layer includes forming a metallization layer that includes over-gate routings in the periphery area, slot holes in the periphery area, and contact holes in the periphery area.

5. The method of claim 1, wherein forming a metallization layer includes forming a silicide compound, forming a barrier layer, and forming a conductive layer.

6. A method for making a semiconductor structure in a semiconductor substrate having an array and a periphery, the method comprising:
    depositing a nonconductive stack over a gate and source/drain of a memory cell in the array and over a gate of a transistor in the periphery, the nonconductive stack including a stopping layer and a nonconductive layer;
    photolithographing to mark portions of the array and the periphery, the portions of the array including portions that are superjacent to the gate and source/drain of the memory cell in the array, the portions of the periphery includes portions that are superjacent to the gate of the transistor;
    removing the portions of the array and the periphery that are marked to expose a polycrystalline silicon layer of the gate and source/drain of the memory cell in the array and to expose the gate of the transistor in the periphery; and depositing simultaneously local interconnect materials into portions of the array and the periphery that were removed by the act of removing.

7. The method of claim 6, wherein photolithographing includes photolithographing to mark portions of an array and a periphery, wherein a portion of the array includes local interconnect, and wherein a portion of the periphery includes gate straps, contact holes, contact slots, and local routing.

8. The method of claim 7, wherein removing includes etching away the revealed portions of the array so as to open up selected areas of the portion of the array and the portion of the periphery, wherein etching includes etching using a dry etch technique.

9. The method of claim 8, wherein depositing includes depositing simultaneously local interconnect materials, wherein the local interconnect materials include a combination of a substance to form a silicide, a barrier substance, and a substance to form a main conductive layer.

10. The method of claim 9, wherein depositing includes depositing simultaneously local interconnect materials, wherein the local interconnect materials includes titanium, titanium nitride, and tungsten.

11. A method for making a semiconductor structure in a substrate having an array and a periphery, comprising:

photolithographing to mask portions of gates in the array and the periphery, the gates including a polycrystalline silicon layer;

dry-etching portions of the gates that are masked;

depositing over the gates a nonconductive stack having a stopping layer;

photolithographing portions of the array and the periphery that include the gates;

dry-etching the portions of the array and the periphery until stopped by the stopping layer to expose a portion of the polycrystalline layer of at least one of the gates in the array and the periphery; and depositing simultaneously local interconnect materials into portions of the array and the periphery that are etched by the act of dry-etching.

12. The method of claim 11, further comprising depositing a group of materials to form gate structures, wherein the group of materials include a combination of a gate oxide material, polycrystalline silicon, a conductive material, and a cap dielectric material, wherein the conductive material include a conductor material and/or a barrier material, and wherein the act of depositing a group of materials to form gate structures occurs before the act of photolithographing to expose gate structures in an array and a periphery.

13. The method of claim 12, wherein photolithographing to mask portions of gates in an array and a periphery includes photolithographing to exhume contact in a portion of gate structures in the array and to open the portion of gate structures in the periphery so as to strap a conductive material to the portion of the gate structures in the periphery.

14. The method of claim 13, wherein dry-etching includes dry-etching a portion of the conductive material and the cap dielectric material.

15. The method of claim 14, further comprising stripping a resist that is formed by photolithographing, forming spacers, depositing a dielectric liner, and depositing borophosphosilicate glass.

16. The method of claim 15, wherein dry-etching the portions of the array and the periphery that are exposed includes etching to remove a portion of the borophosphosilicate glass and a portion of the dielectric liner.

17. The method of claim 16, further comprising depositing a substance to form a silicide compound, a barrier compound, and a conductive substance.

18. The method of claim 17, further comprising planarizing using a chemical-mechanical planarization technique to planarize the conductive substance.

19. A method for forming a routing in a periphery area of a semiconductor structure, comprising:

forming from a nonconductive stack a first trench that superjacently abuts along a substantial length of a first gate stack in the periphery and further forming a second trench that superjacently abuts a second gate stack in the periphery, the first gate stack including a gate oxide layer, a polycrystalline silicon layer formed on the gate oxide layer, a conductive layer formed on the polycrystalline layer, and a gate cap layer formed on the conductive layer and second gate stack including a polycrystalline silicon layer, the nonconductive stack including a stopping layer that stops an etching process once etched away to define the bottom of the trenches and expose at least a portion of the polycrystalline silicon layer of the second gate stack; and filling the trenches with a conductive stack to form the routing over the first gate stack and a conductive strap for the second gate stack, the first trench having a large cross-sectional area to decrease a horizontal resistance of the routing.

20. The method of claim 19, further comprising forming the nonconductive stack by depositing the stopping layer over the gate stack and a dielectric layer over the stopping layer.

21. The method of claim 20, wherein forming the trench includes photolithographing the nonconductive stack and etching the nonconductive stack until the act of etching is stopped when the stopping layer is consumed by the act of etching.

22. The method of claim 21, wherein etching includes dry etching the nonconductive stack.

23. The method of claim 22, wherein the conductive stack includes titanium.

24. A method for making semiconductor structures on a substrate having an array area and a periphery area, comprising:

forming from a nonconductive stack a number of openings to expose a number of semiconductor structures in the array area and in the periphery area, the nonconductive stack including a stopping layer to stop an etching process once etched away to define the bottom of each opening and expose a portion of a polycrystalline silicon layer for at least one of the semiconductor structures in the array area and in the periphery area; and filling the number of openings with a conductive stack having the characteristic to reduce a vertical resistance of each semiconductor structure and a horizontal resistance of each semiconductor structure so as to increase the performance of each semiconductor structure.

* * * * *